SIGNAL SEEKING RECEIVER WITH STOP-HUNTING MEANS RESPONSIVE TO BOTH CARRIER STRENGTH AND TIME-DERIVATIVE THEREOF

Filed June 10, 1955 2 Sheets-Sheet 1

INVENTOR.
Frederick P. Hill &
Theodore A. Byles
BY Mueller & Aichele
Attys.

INVENTORS
Frederick P. Hill &
Theodore A. Byles
BY
Mueller & Aichele
Attys.

United States Patent Office 2,791,685

Patented May 7, 1957

2,791,685

SIGNAL SEEKING RECEIVER WITH STOP-HUNTING MEANS RESPONSIVE TO BOTH CARRIER STRENGTH AND TIME-DERIVATIVE THEREOF

Frederick P. Hill, Elgin, and Theodore A. Byles, Villa Park, Ill., assignors to Motorola, Inc., Chicago, Ill., a corporation of Illinois Application June 10, 1955, Serial No. 514,452

12 Claims. (Cl. 250—20)

Figures 1, 2:
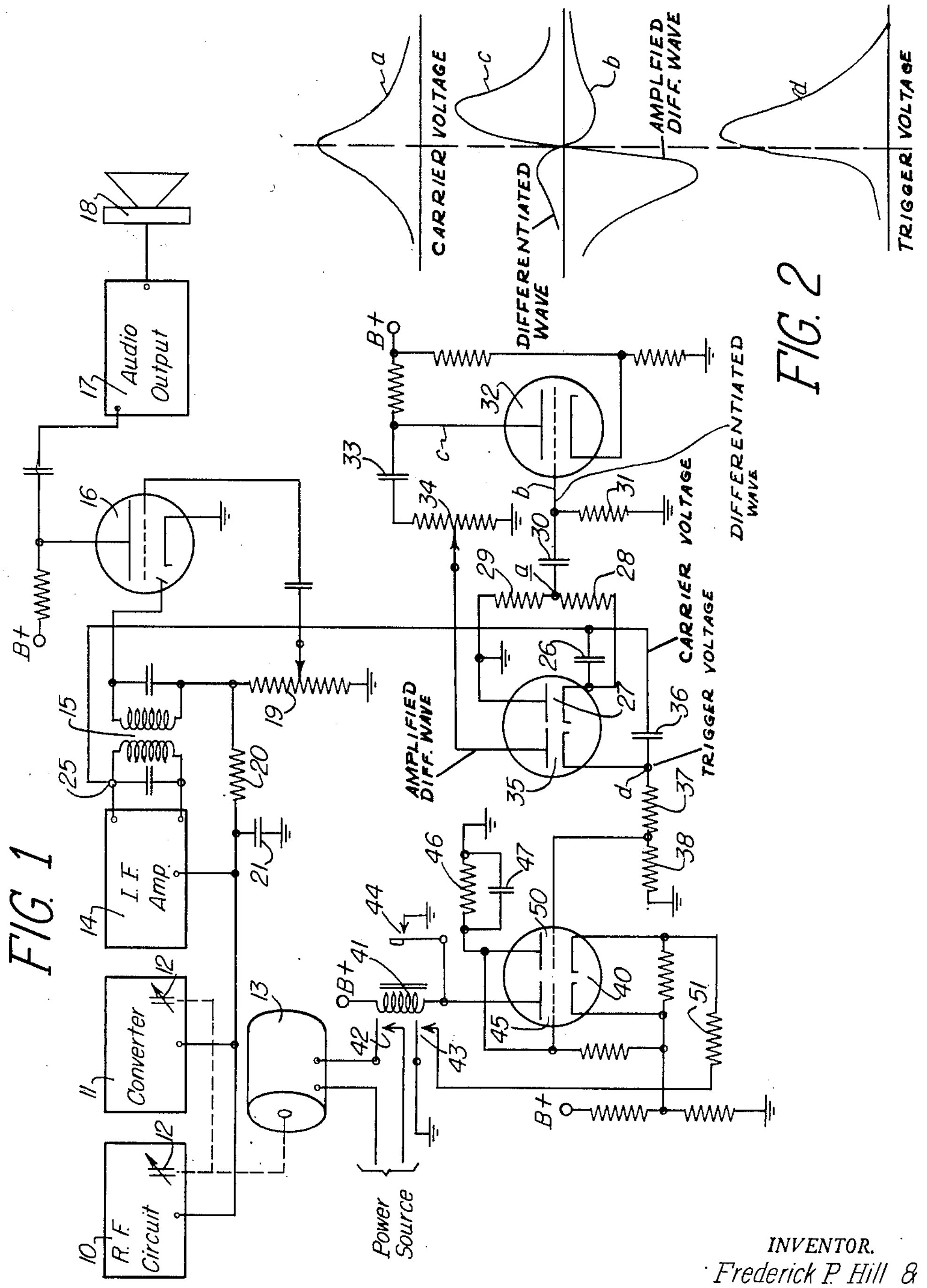

This invention relates generally to tuning controls for wave signal receivers, and more particularly to a system for stopping a motor driven tuner in response to the reception of a carrier wave by the receiver.

Automatic tuning systems have been developed wherein the tuning elements of a radio receiver or the like are driven through a frequency range by a motor with a control system being provided for stopping the motor when a carrier wave is received. However, such systems have been relatively complex and have had the disadvantage that the control is not sufficiently precise to stop the tuning movement at exactly the desired position. Another difficulty has been to provide reliable tuning to carrier waves which are of different signal strengths within a given range, with the receiver being tuned to the center frequency regardless of the signal strength.

It is therefore an object of the invention to provide an improved control circuit for an automatic tuner which stops the tuner when a carrier wave is received.

Another object of the invention is to provide a stop-on-carrier tuner control circuit which provides tuning at the center frequency of a received carrier wave substantially independently of the strength of the received wave within a given range of levels.

A still further object of the invention is to provide a circuit for controlling an automatic tuner which provides a trigger pulse with a very steep rise which occurs at the center frequency of a received carrier wave.

A feature of the invention is the provision of a tuner control circuit which derives a voltage wave representative of the strength of the received carrier wave, differentiates the voltage wave to provide a pulse at the leading edge of the voltage wave and combines the wave and the pulse differentially to produce a sharp trigger pulse the leading edge of which is substantially at the center point of the voltage wave.

A further feature of the invention is the provision of a system which utilizes the automatic volume control voltage of a radio receiver for providing a trigger voltage for an automatic tuner and includes means for differentiating the automatic volume control voltage, amplifying the differentiated voltage and then combining the same with the original automatic volume control voltage to provide a sharp triggering pulse. The two voltages may be combined and applied to a relay control circuit or may be applied to individual tubes of a relay control circuit having the control relay in the common output circuit of the two tubes.

Another feature of the invention is the provision of a trigger circuit for an automatic tuner as described in the preceding paragraph wherein the first audio amplifier of the receiver is conditioned during tuning to amplify the differentiated wave which is thereafter combined with the automatic volume control voltage to produce a sharp triggering pulse.

Still another feature of the invention is the provision of an automatic tuning trigger circuit in which the relay control is provided by a two-tube trigger circuit with the first tube combining the automatic volume control voltage and the differentiated voltage in a grid controlled rectifier circuit, and the second tube serving as a relay control stage.

Figures 3, 4, 5:
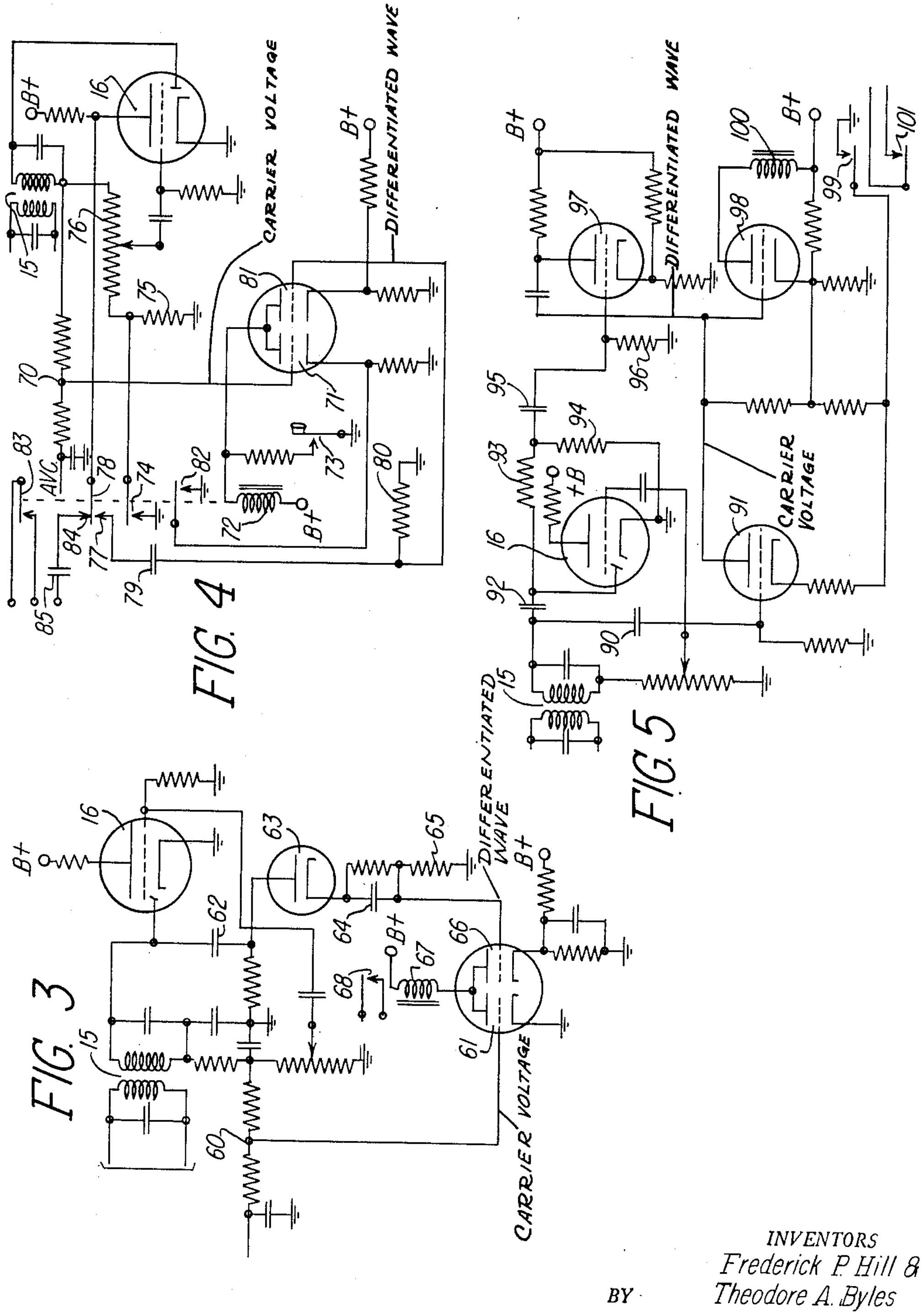

Further objects, features and the attending advantages of the invention are apparent from a consideration of the following description when taken in connection with the accompanying drawings in which Fig. 1 is a schematic diagram of a receiver with the control circuit in accordance with the invention;

Fig. 2 is a group of curves illustrating the operation of the control circuit; and Figs. 3, 4 and 5 illustrate various circuit arrangements of the control system in accordance with the invention.

In practicing the invention there is provided a radio receiver or the like of the superheterodyne type including an intermediate frequency amplifier. The receiver may include a detector coupled to the intermediate frequency amplifier for deriving a voltage representative of the strength of the waves therein. The voltage normally used for automatic volume control of the receiver may be used for this purpose. The rectified voltage is applied to a differentiating circuit which produces a pulse at the leading edge of the control voltage pulse. The differentiated pulse may be amplified to increase the level thereof to substantially the same level as that of the control pulse. The two pulses may then be combined differentially to provide a sharp trigger pulse for controlling a relay which in turn controls the tuner motor. As the differentiated pulse returns to zero when the main pulse is a maximum, the combined trigger pulse will have a sharp rise at the center frequency of the main pulse. A switching arrangement may be provided wherein the audio amplifier of the receiver is utilized to amplify the differentiated pulse. Also the main pulse and the differentiated pulse may be combined in various ways through rectifiers or may control separate tubes having a common output circuit which controls the relay.

Referring now to the drawings, in Fig. 1 there is shown a wave signal receiver which may be a radio receiver having a radio frequency input circuit 10 and a converter 11. Both of these circuits may include variable tuning elements represented by the variable condensers 12 which may be moved by motor 13. The output of the converter, which is at a fixed frequency, is applied to intermediate frequency amplifier 14 and through the output transformer 15 thereof to the tube 16 which serves as an audio detector and first audio frequency amplifier. The audio signal from the stage 16 is applied to an audio output stage 17 and from this stage to the loud speaker or other reproducing device 18. Connected to the detector is a potentiometer 19 from which audio voltage is applied to the first audio frequency amplifier. Also connected to the detector is a time constant circuit including resistor 20 and condenser 21 which produces the automatic volume control voltage which may be fed back to the preceding stages for controlling the gain thereof.

Considering now the tuning trigger circuit itself in the circuit of Fig. 1, this is coupled from point 25 on the output circuit 15 of the intermediate frequency amplifier through condenser 26 and diode 27. Accordingly, across resistors 28 and 29 there is provided a voltage representative of the strength of the carrier wave in the intermediate frequency amplifier. A portion of this voltage from point $a$ is applied to the differentiating circuit including condenser 30 and resistor 31. The voltage at point $a$ is shown by curve $a$ in Fig. 2, and the differentiated voltage from point $b$ is shown by curve $b$ in Fig. 2. The differentiated voltage is increased in amplitude and reversed in phase by the triode amplifier 32 to provide a voltage at the output as shown by curve $c$. This voltage is applied through condenser 33 to potentiometer 34 from which a portion of the differentiated wave is applied to the plate of rectifier 35. The voltage from point 25 is also applied through condenser 36 to the cathode of detector 35. Accordingly, the voltage represented by curve *c* is applied to the plate and the voltage represented by curve *a* is applied to the cathode of the diode 35. The diode cannot conduct as long as the plate thereof is negative with respect to its cathode. Therefore no output will appear at point *d* until the negative portion of curve *c* passes. The amplitude of the curve *c* may be adjusted by the potentiometer 74 so that the diode 35 does not conduct until the center frequency is reached. The output of the diode is a pulse with a very steep front as shown by curve *d*. This pulse is developed across resistors 37 and 38 and a portion of the pulse is applied to the trigger circuit including tube 40.

The trigger circuit which includes the double triode 40 also includes relay 41 having contacts 42 for energizing the tuning motor 13, and an additional set of contacts 42 the purpose of which will be hereinafter described. To initiate operation of the system, the relay 41 may be energized by operation of switch 44. This will cause the motor to operate to tune the receiver away from the station to which it may have been tuned. The triode section 45 will then conduct and hold the relay 41 operated. This condition is established by applying proper biases to the triode 45.

The voltage at the grid of the triode 45 is applied across resistor 46 and condenser 47 to form an operating potential for the plate of triode 50 which is included with the triode 45 in the single tube designated 40. The contacts 43 connect resistor 51 between the cathode of the triode 50 and ground to establish a very small bias at the cathode. Accordingly, when the positive pulse is applied to the grid of the triode 50 from resistors 37 and 38, the triode will conduct so that the plate potential will drop. This drops the grid potential of the triode 45 so that the triode is cut off and the relay 41 is thereby deenergized. This causes contacts 43 to open so that a larger bias is applied to the cathode of triode 50. Accordingly, this tube will not conduct until a further tuning cycle is initiated.

The circuit shown in Fig. 3 operates in fundamentally the same way as that of Fig. 1. However, the circuit arangement is somewhat different. In Fig. 3, 15 is the tuned output circuit of the intermediate frequency amplifier and 16 is the combined detector and audio amplifier as in the system of Fig. 1. The automatic volume control voltage normally utilized in the receiver is derived at the point 60. This is a negative voltage which increases with signal strength and is effective to cut off the triode 61 when a signal is received. The triode 61 is biased to be normally conducting.

A differentiated pulse is produced in this system by applying the intermediate frequency signal from the secondary of the tuned circuit 15 of the intermediate frequency amplifier through condenser 62 to diode 63. The diode 63 operates to charge condenser 64 through resistor 65 to thereby provide the differentiated pulse across the resistor 65. This pulse is applied to the grid of the triode section 66 which is normally cut off. The section 66 conducts because of the positive pulse developed across resistor 65, with the plate curve thereof maintaining the relay 67 closed.

It will be noted that the relay 67 is connected to plates of both triodes 61 and 66 to be held closed when either triode conducts. The relay is normally held closed by conduction of triode 61. However, when triode 61 is cut off by the signal response, the triode 66 conducts due to the presence of the differentiated pulse to hold the relay closed. When the differentiated pulse passes, however, the diode 66 returns to its non-conducting condition and diode 61 is still cut off so that the relay 67 drops out. Accordingly, the contacts 68 thereof will open and these contacts can be used to control the tuning motor such as the motor 13 of Fig. 1.

Fig. 2 may be used for explaining the operation of Fig. 3 in much the same way as applied to the system of Fig. 1. The voltage at point 60 is represented in Fig. 2 by curve *a*. However, this voltage will be a negative voltage instead of a positive voltage as shown. The voltage applied to the grid of triode 66 will be that shown by curve *b* of Fig. 2, being initially a positive voltage which renders the triode 66 conducting and then later a negative voltage which causes the same to be cut off. The value of the voltage required to operate the triode 66 may be set by fixing the cathode bias, which is controlled by a voltage divider connected to B plus potential. Although the curve *d* of Fig. 2 is not produced in the system of Fig. 3, this curve illustrates the action of the relay 67 which is conducting until the differentiated pulse passes. The relay therefore drops out at the time illustrated by curve *d*.

In the system of Fig. 4 the standard receiver components are utilized in the tuning control circuit by the use of additional contacts on the control relay for changing the connections. Tuned circuit 15 is the output circuit of the intermediate frequency amplifier as in preceding embodiments and 16 is the combined detector and first audio amplifier tube. The automatic volume control voltage of the receiver is derived from point 70 and is applied to the triode section 71 in generally the same manner as illustrated in Fig. 3. During tuning operation the relay 72 is energized, being initially energized by closing the switch 73. This causes contact 74 to close to short out resistor 75 connected in series with the volume control potentiometer 76 during normal receiver operation. The audio frequency amplifier will therefore serve as a pulse amplifier with the pulse being applied from the plate thereof to contact 78 which is in engagement with fixed contact 77 when the relay 72 is energized. This applies the pulse to differentiating circuit including condenser 79 and resistor 80, with the differentiated pulse across resistor 80 being applied to the grid of the triode section 81.

The triode sections 71 and 81 operate in generally the same manner as triode sections 61 and 66 in the system of Fig. 3 to hold the relay 72 energized until the differentiated pulse passes. That is, the triode 71 which is normally conducting will be cut off by the negative voltage from point 70. The positive differentiated pulse will render the triode section 81 conducting to hold the relay 72 energized. The positive differentiated pulse is of short duration and is followed by a negative pulse to cut off the tube 81 so that the relay 72 will drop out. Contacts 82 of the relay 72 reduce the bias on triode 71 during tuning operation so that the triode section 71 is not cut off until a predetermined negative voltage is applied. Contacts 83 may control the tuning motor such as the motor 13 of Fig. 1.

When the relay 72 drops out movable contact 78 will engage the fixed contact 84 as shown to apply the audio output of the tube 16 through condenser 85 to the power amplifier circuit.

A still further embodiment of the system is illustrated in Fig. 5. The tuned circuit 15 of the intermediate frequency amplifier and the tube 16 which forms the audio detector and audio amplifier are the same as in the prior embodiments. The signal from the intermediate frequency amplifier is applied through condenser 90 to the triode 91 wherein the signal is amplified. The signal is also applied through condenser 92 to the diode section of the tube 16 with the rectified output appearing across resistors 93 and 94. A portion of this rectified pulse is applied to the differentiating circuit formed by condenser 95 and resistor 96, and is inverted and amplified in the triode 97. A positive voltage is applied from the triode 97 to the grid of triode 98 to hold the triode 98 conducting. However, this pulse is of short duration and returns sharply to zero at the center frequency as illustrated by curve *b* of Fig. 2. In the meantime the signal applied to the triode 91 has rendered the same conducting to reduce the plate voltage so that the voltage applied to the grid of triode 98 thereby is reduced. Accordingly the triode 98 is cut off as soon as the positive pulse from triode 97 is removed. This causes the relay 100 to drop out to open the contacts 101 to stop the tuning motor. Contacts 99 are closed by relay 100 during tuning to reduce the bias on the triode 91 so that it responds to the signal applied thereto.

It will be apparent from the foregoing that a trigger circuit is provided which produces a sharp pulse for controlling tuning elements of a receiver in response to the reception of a carrier wave. The differentiated pulse effectively removes the effect of the main pulse until the center frequency is reached. This produces a control or trigger pulse with a very steep rise which is effective as a carrier wave is approached from either direction. That is the differentiated pulse will effectively take out the part of the main pulse corresponding to the approach to a carrier wave center frequency regardless of whether the tuning is increasing or decreasing in frequency. The circuits required are relatively simple to provide a highly desirable overall system.

We claim:

1. Tuning apparatus for controlling the frequency of a wave signal receiver including in combination, movable tuning elements for tuning the receiver through a band of frequencies, driving means for said tunable elements, circuit means coupled to the wave signal receiver for deriving a first voltage pulse in response to the tuning of the receiver through a frequency range including a carrier wave, with the pulse representing the strength of the received carrier wave, a differentiating network connected to said circuit means for producing from said first voltage pulse a wave including a second pulse originating substantially simultaneously with said first voltage pulse and terminating as said first pulse reaches its maximum, and control means coupled to said circuit means and to said differentiating network for controlling said driving means, said control means being responsive to said first and second pulses and operated by said first pulse at the termination of said second pulse to provide a control operation.

2. Tuning apparatus for controlling the frequency of a wave signal receiver including in combination, movable tuning elements for tuning the receiver through a band of frequencies, driving means for said tunable elements, circuit means coupled to the wave signal receiver for deriving a first voltage pulse in response to the tuning of the receiver through a frequency range including a carrier wave, a differentiating network connected to said circuit means for producing from said first voltage pulse a wave including a second pulse originating substantially simultaneously with said first voltage pulse and terminating as said first pulse reaches its maximum, and control means coupled to said circuit means and to said differentiating network for controlling said driving means, said control means being rendered inoperative by said second pulse and responding to said first pulse at the termination of said second pulse to provide a control operation.

3. Tuning apparatus for automatically tuning a wave signal receiver to a received carrier wave including in combination, movable tuning elements, driving means for causing said tunable elements to sweep through a range of frequencies, circuit means coupled to the wave signal receiver for deriving a first wave the amplitude of which corresponds to the amplitude of a carrier wave received by the receiver as the tuning elements sweep through the frequency range including the carrier wave, a differentiating network connected to the receiver for producing a second wave including a pulse originating substantially simultaneously with said first wave and terminating as said first wave reaches its maximum, and control means coupled to said circuit means and to said differentiating network and including a portion operative to control said driving means, said control means including means responsive to said pulse for preventing operation of said control portion during the presence of said first pulse, said control means including additional means responsive to said first wave to cause operation of said control portion at the termination of said pulse, so that said control portion stops said driving means at the termination of said first pulse.

4. Tuning apparatus for controlling the frequency of a wave signal receiver including in combination, movable tuning elements for tuning the receiver through a band of frequencies, driving means for said tunable elements, circuit means coupled to the wave signal receiver for deriving a first voltage pulse in response to the tuning of the receiver to a frequency range including a carrier wave, a differentiating network coupled to the receiver for producing a wave including a second pulse originating substantially simultaneously with said first voltage pulse and terminating as said first pulse reaches its maximum, and control means for controlling said driving means including first and second electron valves and relay means controlled thereby, means applying said first pulse to said first valve in a manner to change the conductivity thereof with said second valve thereby tending to operate said relay, means for applying said second pulse to said second valve to render the same conductive to prevent operation of said relay by said first valve, so that said relay is prevented from operating for the duration of said second pulse and operates at the termination of said second pulse in response to said first pulse.

5. Tuning apparatus for controlling the frequency of a wave signal receiver including in combination, movable tuning elements for tuning the receiver through a band of frequencies, driving means for said tunable elements, circuit means coupled to the wave signal receiver for deriving a first voltage pulse in response to the tuning of the receiver through a frequency range including a carrier wave, which pulse represents the strength of the received carried wave, a differentiating network connected to said circuit means for producing a wave including a second pulse originating substantially simultaneously with said first voltage pulse and having substantially the same amplitude as said first pulse but a shorter duration, and control means coupled to said circuit means and to said differentiating network and responsive to said first and second pulses to delay the effect of said first pulse for the duration of said second pulse, said control means controlling said driving means.

6. Tuning apparatus for controlling the frequency of a wave signal receiver including in combination, movable tuning elements for tuning the receiver through a band of frequencies, driving means for said tunable elements, circuit means coupled to the wave signal receiver for deriving a first voltage pulse in response to the tuning of the receiver through a frequency range including a carrier wave, which pulse represents the strength of the received carrier wave, a differentiating network connected to said circuit means for producing from said first voltage pulse a wave including a second pulse originating substantially simultaneously with said first voltage pulse and having substantially the same amplitude as said first pulse but a shorter duration, means coupled to said circuit means and to said differentiating network for combining said first and second pulses in opposition so that said second pulse cancels a portion of said first pulse to provide a sharp trigger pulse and means responsive to said trigger pulse for controlling said driving means.

7. Tuning apparatus for automatically tuning a wave signal receiver to a received carrier wave including in combination, movable tuning elements, driving means for causing said tunable elements to sweep through a range of frequencies, circuit means coupled to the wave signal receiver for deriving a first wave the amplitude of which corresponds to the amplitude of a carrier wave received by the receiver as the receiver is tuned through a frequency range including the carrier wave, a differentiating network connected to the receiver for producing a second wave including a pulse originating substantially simultaneously with said first wave and terminating as said first wave reaches its maximum, and control means for controlling operation of said driving means including rectifier means coupled to said circuit means and to said differentiating network, said pulse being applied to said rectifier means to prevent conduction therein and said first wave being applied to said rectifier means and being rectified thereby at the termination of said pulse to produce a trigger voltage, said control means including a portion operating to stop said driving means in response to said trigger voltage.

8. Tuning apparatus for automatically tuning a wave signal receiver to a received carrier wave including in combination, movable tuning elements, driving means for causing said tunable elements to sweep through a range of frequencies, circuit means coupled to the wave signal receiver including a portion for deriving a first wave the amplitude of which corresponds to the amplitude of a carrier wave received by the receiver as the receiver is tuned through a frequency range including the carrier wave, said circuit means including a differentiating network for producing a second wave including a pulse originating substantially simultaneously with said first wave and terminating as said first wave reaches its maximum, control means for controlling operation of said driving means including rectifier means coupled to said circuit portion and to said differentiating network, means for applying said pulse to said rectifier means to prevent conduction therein, and means for applying said first wave to said rectifier means with said first wave being rectified at the termination of said pulse to produce a trigger voltage, said control means including a portion operating to stop said driving means in the response to said trigger voltage to thereby stop movement of said tuning elements at substantially the maximum point of said first wave.

9. Tuning apparatus for controlling the frequency of a wave signal receiver including in combination, movable tuning elements for tuning the receiver through a band of frequencies, driving means for said tunable elements, circuit means coupled to the wave signal receiver for deriving a first voltage pulse in response to the tuning of the receiver through a frequency range including a carrier wave, which pulse represents the strength of the received carrier wave, said circuit means including a differentiating network for producing a wave including a second pulse originating substantially simultaneously with said first voltage pulse and terminating as said first pulse reaches its maximum, and control means for controlling said driving means including first and second electron valves having a common output circuit and relay means in said output circuit held operative when one of said first and second valves conducts, biasing means connected to said first valve normally holding the same conducting, means connecting said first valve to said circuit means for applying said first pulse thereto to render said first valve non-conducting, biasing means connected to said second valve normally rendering the same non-conductive, and means connecting said second valve to said differentiating network for applying said second pulse thereto for rendering said second valve conductive, whereby said second valve holds said relay operative for the duration of said second pulse and said relay drops out at the termination of said second pulse in the presence of said first pulse.

10. Tuning apparatus for controlling the frequency of a wave signal receiver including in combination, movable tuning elements for tuning the receiver through a band of frequencies, driving means for said tunable elements, circuit means coupled to the wave signal receiver for deriving a first voltage pulse in response to the tuning of the receiver through a frequency range including a carrier wave, which pulse represents the strength of the received carrier wave, a differentiating network connected to the receiver for producing a wave including a second pulse originating substantially simultaneously with said first voltage pulse and terminating as said first pulse reaches its maximum, and control means for controlling said driving means including first and second electron valves having a common output circuit and relay means in said output circuit held operative when one of said first and second valves conducts biasing means normally holding said first valve conducting means connecting said first valve to said circuit means for applying said first pulse thereto for rendering said first valve non-conducting in the presence of said first pulse, means normally holding said second valve non-conductive, and means connecting said second valve to said differentiating network for rendering said second valve conductive by said second pulse, so that said second valve holds said relay operative for the duration of said second pulse and said relay drops out at the termination of said second pulse, said relay being connected to said driving means and operating to stop movement of said tunable elements when said relay drops out.

11. Tuning apparatus for automatically tuning a wave signal receiver to a received carrier wave including in combination, movable tuning elements, electrical driving means for causing said tunable elements to sweep through a range of frequencies, circuit means coupled to the wave signal receiver for deriving a first voltage wave in response to the tuning of the receiver through a band of frequencies including a carrier wave, with the voltage wave representing the amplitude of the received carrier wave, a differentiating network coupled to the receiver for producing a wave including a pulse originating substantially simultaneously with said first voltage wave and terminating as said first wave reaches its maximum, and means for controlling operation of said driving means including a first electron valve coupled to said circuit means, a second electron valve coupled to said first valve, and a relay coupled to said second valve and operating to stop said driving means, said second valve being biased to be conducting to hold said relay operated to energize said driving means, said first valve being biased to be non-conductive, means for applying said first voltage wave to said first valve to cause the same to conduct, said first valve when conducting tending to render said second valve non-conducting, and means for applying said second pulse to said second valve to hold the same conducting so that said second valve is conducting for the duration of said second pulse and is then rendered non-conducting in response to said first pulse to release said relay and thereby deenergize said driving means.

12. Tuning apparatus for automatically tuning a wave signal receiver to a received carrier wave, which receiver includes a circuit wherein a wave is developed corresponding to the strength of a received carrier wave as the receiver is tuned through a frequency range including the carrier wave, said apparatus including in combination, movable tuning elements, electrical driving means for causing said tunable elements to sweep through a range of frequencies, control means for controlling operation of said driving means, including a first electron valve coupled to the receiver circuit, a second electron valve coupled to said first valve, and a relay coupled to said second valve and operating to start said driving means when said second valve conducts and stops said driving means when said second valve is non-conducting, means for applying the wave corresponding to the strength of a received carrier wave to said first valve for rendering the same conducting when a carrier wave is received, said first valve when conducting tending to render said second valve non-conducting, a differentiating network coupled to the receiver circuit for producing a wave including a pulse originating substantially simultaneously with the wave in the receiver circuit and terminating as the receiver circuit wave reaches its maximum, and means for applying said pulse to said second valve to hold the same conducting so that said second valve is conducting for the duration of said second pulse and is then rendered non-conducting in response to said first pulse to release said relay and thereby deenergize said driving means.

References Cited in the file of this patent

UNITED STATES PATENTS

| | | |
|---|---|---|
| 2,516,856 | Cowles | Aug. 1, 1950 |
| 2,541,017 | Alexander | Feb. 13, 1951 |